(12) United States Patent
Sonohara, Sr.

(10) Patent No.: US 8,174,123 B2
(45) Date of Patent: May 8, 2012

(54) SEMICONDUCTOR INTEGRATED CIRCUIT

(75) Inventor: Hideo Sonohara, Sr., Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 151 days.

(21) Appl. No.: 12/647,135

(22) Filed: Dec. 24, 2009

(65) Prior Publication Data

US 2010/0155726 A1    Jun. 24, 2010

(30) Foreign Application Priority Data

Dec. 24, 2008  (JP) ................................. 2008-327984

(51) Int. Cl.
    *H01L 23/48*    (2006.01)
(52) U.S. Cl. ... 257/773; 257/784; 257/691; 257/E23.01; 257/781
(58) Field of Classification Search .......... 257/664–665, 257/734–786, E29.111–E29.165, E23.01–E23.079, 257/E23.141–E23.179
    See application file for complete search history.

(56) References Cited

U.S. PATENT DOCUMENTS

| 6,762,499 | B2 | 7/2004 | Nakadaira | |
|---|---|---|---|---|
| 2004/0016980 | A1 | 1/2004 | Nakadaira | |
| 2005/0218916 | A1 * | 10/2005 | Hirai | 324/756 |

FOREIGN PATENT DOCUMENTS

JP    2004-063540    2/2004

* cited by examiner

*Primary Examiner* — Nathan W. Ha
*Assistant Examiner* — Mamadou Diallo
(74) *Attorney, Agent, or Firm* — Young & Thompson

(57) ABSTRACT

A semiconductor integrated circuit according to an exemplary embodiment of the present invention includes an I/O buffer provided in a semiconductor chip, single-layer pads, and multilayer pads. The single-layer pads are formed above the I/O buffer. The multilayer pads are formed above the I/O buffer separately from the single-layer pads. The single-layer pads are pads dedicated to bonding, and the multilayer pads are pads on which both probing and bonding are performed.

10 Claims, 15 Drawing Sheets

REDUCTION IN CHIP SIZE

SEMICONDUCTOR INTEGRATED CIRCUIT

BACKGROUND

1. Field of the Invention

The present invention relates to a semiconductor integrated circuit, and more particularly, to a semiconductor integrated circuit having bonding pads for wire bonding.

2. Description of Related Art

In a wafer test, a probe connected to a tester is brought into contact with each pad, to thereby perform a screening process for determining whether a semiconductor chip is defective or non-defective. A semiconductor integrated device has a configuration in which a semiconductor chip is mounted on a substrate and pads formed on the semiconductor chip are connected to stitches (connecting parts), which are formed on the substrate, via bonding wires such as Au wires.

Japanese Unexamined Patent Application Publication No. 2004-63540 (Nakahira) discloses a semiconductor device having a pad of a single-metal-layer structure and a pad of a two-metal-layer structure, which are formed in one pad. FIG. 16 shows the configuration of the semiconductor device disclosed by Nakahira. As shown in FIG. 16, the semiconductor device disclosed by Nakahira has a pad of a two-metal-layer structure (including a first-layer pad 8 and a second-layer pad 1) and a pad 3 of a single-metal-layer structure, which are formed in one pad.

The first-layer pad 8 and the second-layer pad 1 are connected to each other through a plurality of through holes 11. A line 12 for connecting the second-layer pad 1 and the pad 3 of the single-metal-layer structure is formed of a metal wiring layer. The pad 3 of the single-metal-layer structure is used in a wafer test, and the pad of the two-metal-layer structure is used in wire bonding.

SUMMARY

The present inventor has found a problem as mentioned below. In the semiconductor integrated circuit disclosed by Nakahira, a pad of a single-metal-layer structure and a pad of a two-metal-layer structure are formed in one pad, which poses a problem that the degree of freedom in the layout of pads for bonding is limited.

Accordingly, there is a demand for enhancing the degree of freedom in the layout of pads in a semiconductor integrated circuit.

A first exemplary aspect of the present invention is a semiconductor integrated circuit including: an I/O buffer provided in a semiconductor chip; single-layer pads formed above the I/O buffer; and multilayer pads formed above the I/O buffer separately from the single-layer pads. With this configuration, the single-layer pads and the multilayer pads can be separately arranged, thereby enhancing the degree of freedom in the layout of pads for bonding.

According to an exemplary aspect of the present invention, it is possible to provide a semiconductor integrated circuit capable of enhancing the degree of freedom in the layout of pads in a semiconductor integrated circuit.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Figure 1:
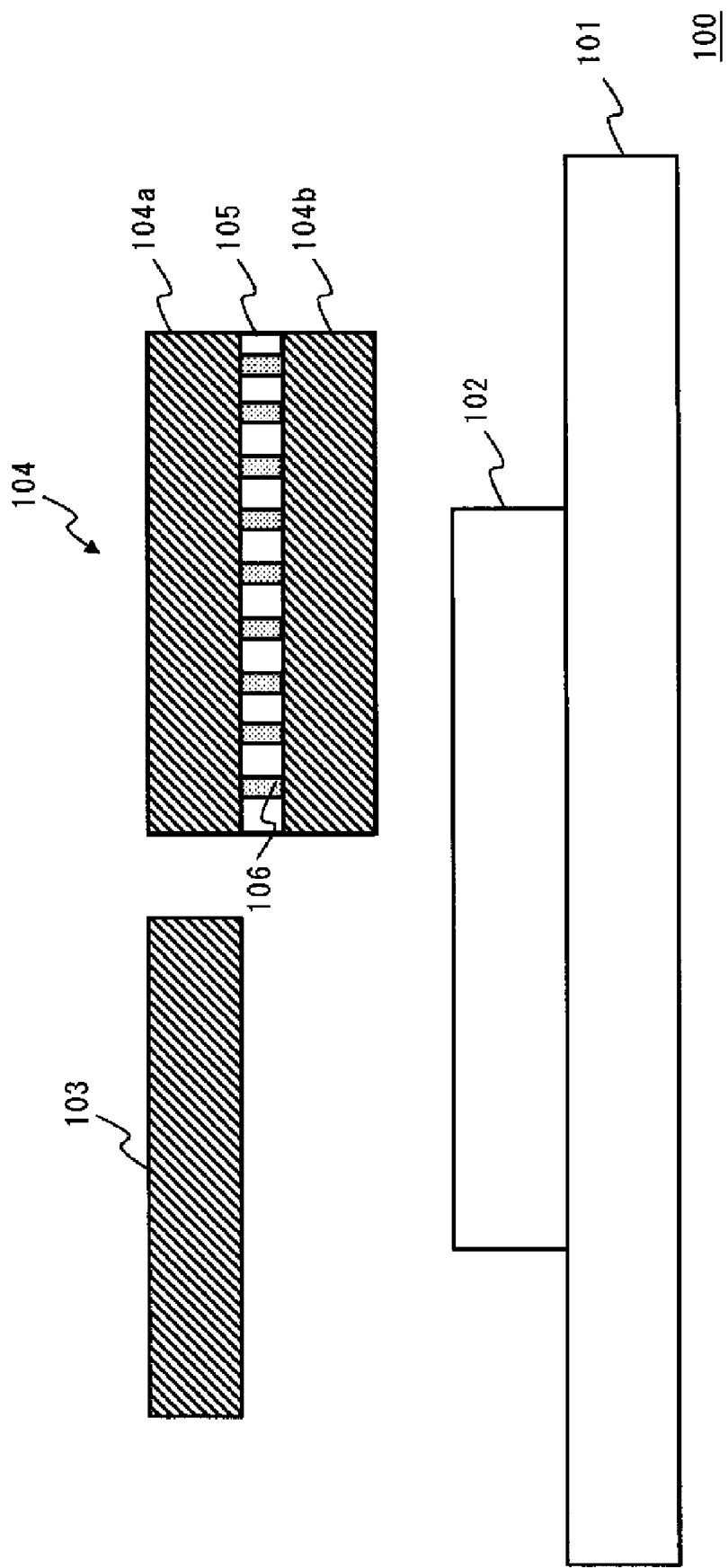
FIG. 1 is a diagram showing a configuration of a semiconductor chip according to a first exemplary embodiment of the present invention.

A semiconductor integrated circuit according to an exemplary embodiment of the present invention will be described below with reference to the accompanying drawings. Throughout the drawings, like components are denoted by like reference symbols and the description thereof is omitted as appropriate. The main part of the semiconductor integrated circuit according to an exemplary embodiment of the invention is enlarged in the drawings for the purpose of illustration.

First Exemplary Embodiment

The configuration of a semiconductor integrated circuit according to a first exemplary embodiment of the present invention will be described with reference to FIG. 1. FIG. 1 is a diagram showing the configuration of a semiconductor chip 100 for use in the semiconductor integrated circuit according to this exemplary embodiment. The semiconductor chip 100 includes a semiconductor substrate 101, an I/O buffer 102, a single-layer pad 103, and a multilayer pad 104.

As the semiconductor substrate 101, a Si substrate is used, for example. The I/O buffer 102 is formed on the semiconductor substrate 101. The I/O buffer 102 is formed at a peripheral portion of the semiconductor chip 100. In FIG. 1, the left side indicates the inside of the semiconductor chip 100 and the right side indicates the outside thereof.

The single-layer pad 103 and the multilayer pad 104 are formed above the I/O buffer 102. A part of the single-layer pad 103 is formed above the I/O buffer 102, and the other part of the single-layer pad 103 is formed so as to project toward the inside of the semiconductor chip 100 relative to the I/O buffer 102. A part of the multilayer pad 104 is formed above the I/O buffer 102, and the other part of the multilayer pad 104 is formed so as to project toward the outside of the semiconductor chip 100 relative to the I/O buffer 102. The entirety of each of the single-layer pad 103 and the multilayer pad 104 may be formed in a region in which the I/O buffer 102 is formed.

In this exemplary embodiment, N metal layers are formed above the semiconductor substrate 101. Although not shown, an interlayer insulating layer is formed between the metal layers. In this exemplary embodiment, an example where the multilayer pad 104 is formed of two metal layers is described.

The multilayer pad 104 includes a first pad 104a formed of an uppermost N-layer metal among the N metal layers, and a second pad 104b formed of an N−1 layer metal which is formed below the first pad 104a. That is, the upper layer of the multilayer pad 104 corresponds to the first pad 104a, and the lower layer of the multilayer pad 104 corresponds to the second pad 104b. An interlayer insulating layer 105 formed between the first pad 104a and the second pad 104b has a plurality of pad vias 106 for connecting the first pad 104a and the second pad 104b to each other.

The single-layer pad 103 is formed of an uppermost N-layer metal. The single-layer pad 103 and the first pad 104a which is the upper layer of the multilayer pad 104 are formed of the same uppermost metal layer. The first pad 104a and the single-layer pad 103 are formed separately from each other. Accordingly, the single-layer pad 103 and the multilayer pad 104 are provided separately from each other.

The I/O buffer 102 is formed of a metal layer that is located below the N-layer metal and the N−1 layer metal, which are used for the single-layer pad 103 and the multilayer pad 104, among the plurality of metal layers. While the example where the multilayer pad 104 is formed of two metal layers has been described above, the structure of the multiplayer pad 104 is not limited thereto.

Figure 2:
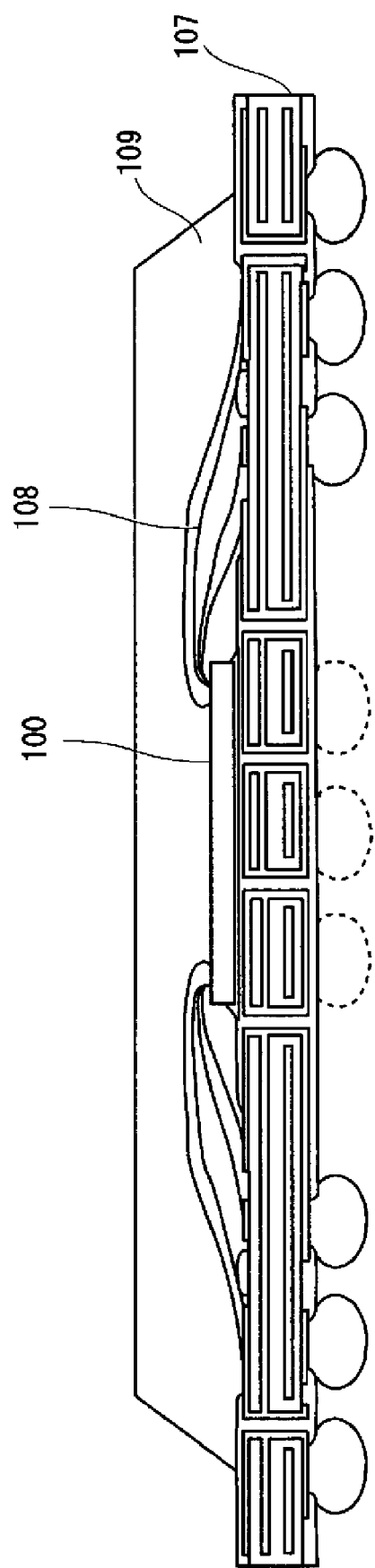
FIG. 2 is a diagram showing a configuration of a semiconductor integrated circuit according to the first exemplary embodiment.

FIG. 2 shows the configuration of the semiconductor integrated circuit according to this exemplary embodiment. As shown in FIG. 2, the semiconductor integrated circuit according to this exemplary embodiment has a configuration in which the single-layer pad 103 and the multilayer pad 104, which are formed in the semiconductor chip 100, are connected to stitches (connecting parts) (not shown), which are formed on a lead frame 107, through bonding wires 108 such as gold wires. The semiconductor chip 100, the bonding wires 108, and the like are covered and sealed with a mold resin 109.

Figure 3:
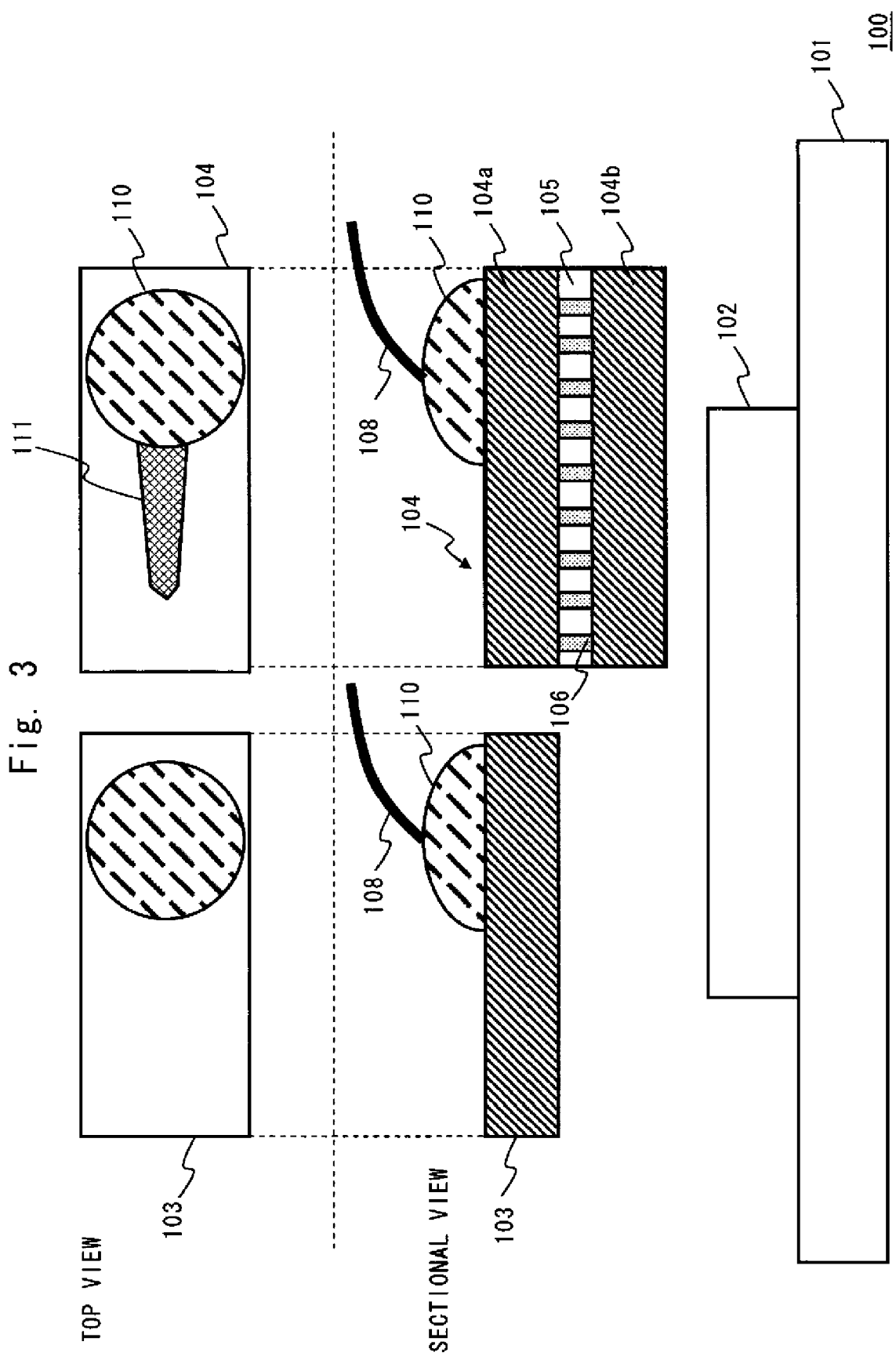
FIG. 3 is a diagram for explaining a state of each of a single-layer pad and a multilayer pad after a wafer test and bonding for the semiconductor chip according to the first exemplary embodiment are carried out.
Figure 4:
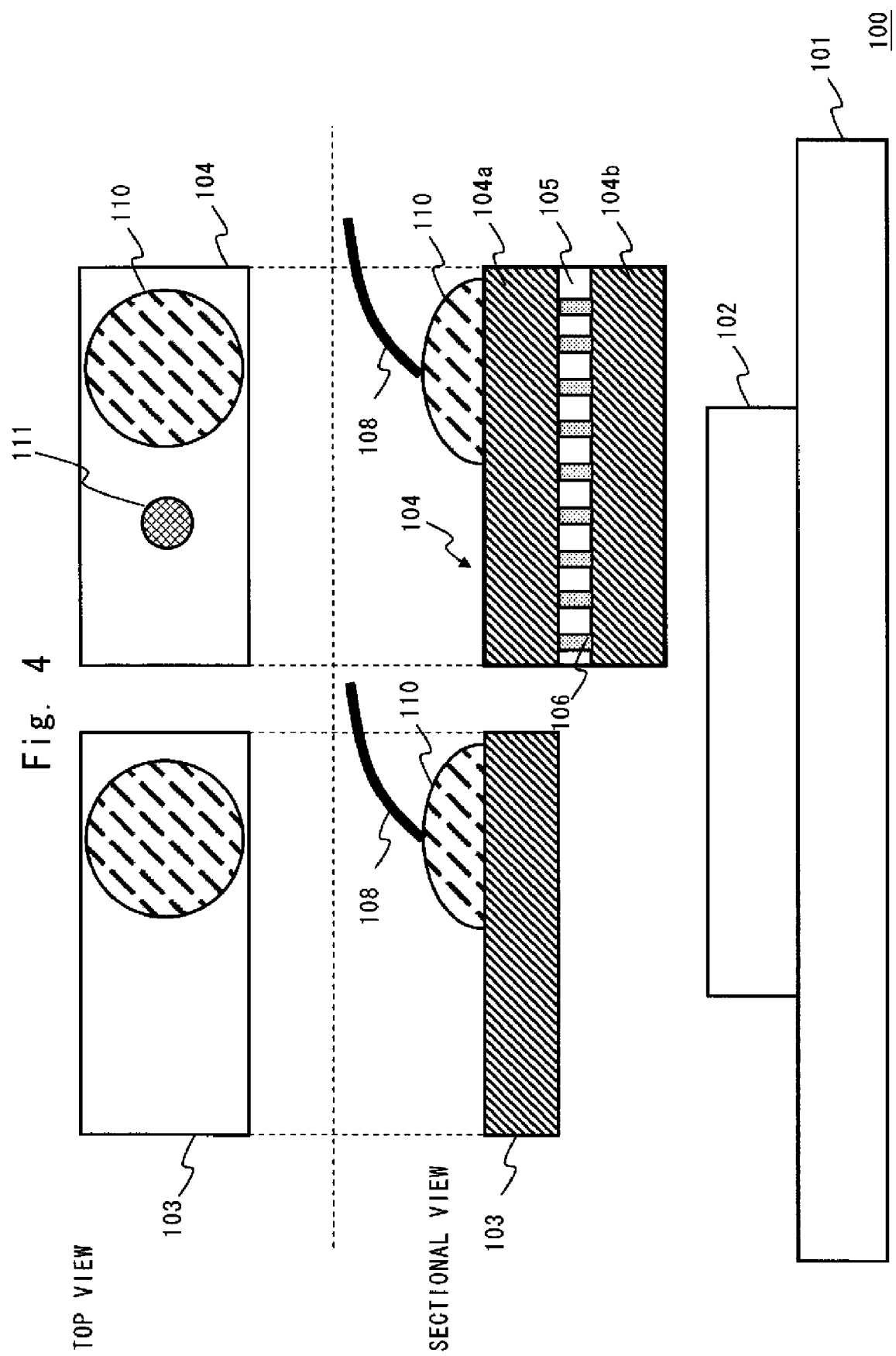
FIG. 4 is a diagram for explaining another state of each of the single-layer pad and the multilayer pad after a wafer test and bonding for the semiconductor chip according to the first exemplary embodiment are carried out.

Referring now to FIGS. 3 and 4, a description is given of the state of each of the single-layer pad 103 and the multilayer pad 104 after a wafer test and bonding are carried out with the semiconductor chip 100. FIGS. 3 and 4 are diagrams for explaining the state of each of the single-layer pad 103 and the multilayer pad 104 after a wafer test and bonding are carried out. FIGS. 3 and 4 illustrate different probe marks 111.

The single-layer pad 103 is a pad dedicated to bonding, and probing is not performed on the single-layer pad 103. Accordingly, as shown in FIGS. 3 and 4, the single-layer pad 103 has no probe mark (needle trace) 111 which is formed during a wafer test. The single-layer pad 103 is connected to the bonding wire 108 through a bonding 110.

The multilayer pad 104 is a pad on which at least probing is performed, and on which not only probing but also bonding is performed. A probe connected to a tester is brought into contact with the multilayer pad 104, to thereby perform a screening process for determining whether the semiconductor chip is defective or non-defective. Accordingly, the probe mark 111 is formed on the multilayer pad 104 when the probe is brought into contact with the multilayer pad 104.

In the example shown in FIG. 3, the probe is pressed against the multilayer pad 104 in such a manner that the probe scratches the surface of the multilayer pad 104 from the side. Thus, the probe mark 111 is like a scratch on the multilayer pad 104.

In the example shown in FIG. 4, the probe is pressed against the multilayer pad 104 vertically from above. Thus, the probe mark 111 is a recess formed in the multilayer pad 104. The multilayer pad 104 is connected to the bonding wire 108 through the bonding 110.

According to this exemplary embodiment, the single-layer pad 103 and the multilayer pad 104 are formed separately from each other. Accordingly, the degree of freedom in the layout of pads for bonding can be enhanced. Further, only bonding is performed on the single-layer pad 103 formed of a single metal layer, and probing is not performed thereon. Accordingly, peeling or the like of the pads is prevented and the bonding strength can be increased. Furthermore, probing as well as bonding can be performed on the multilayer pad 104 formed of a plurality of metal layers.

Second Exemplary Embodiment

Figure 5:
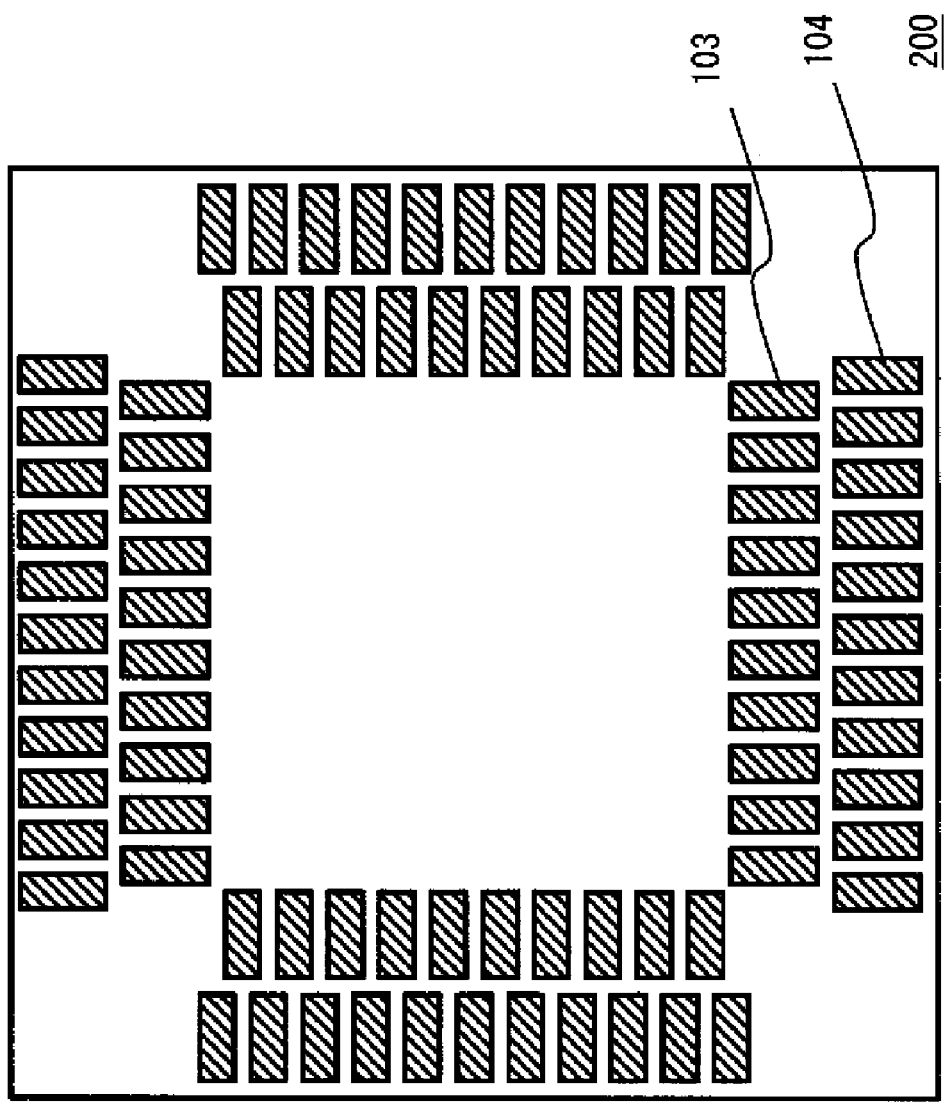
FIG. 5 is a diagram showing a configuration of a semiconductor chip according to a second exemplary embodiment of the present invention.

A semiconductor integrated circuit according to a second exemplary embodiment of the present invention will be described with reference to FIG. 5. FIG. 5 is a diagram illustrating the configuration of a semiconductor chip 200 for use in the semiconductor integrated circuit according to the second exemplary embodiment. In FIG. 5, components identical with those shown in FIG. 1 are denoted by the same reference numerals, and the description thereof is omitted.

As shown in FIG. 5, in this exemplary embodiment, two pad rows are arranged along each edge of the semiconductor chip 200. In a first pad row which is located at the outermost periphery of the semiconductor chip 200, a plurality of multiplayer pads 104 is formed. In a second pad row which is located inside the first pad row, a plurality of single-layer pads 103 is formed. That is, the single-layer pads 103 are formed inside the multilayer pads 104. The single-layer pads 103 and the multilayer pads 104 are arranged in a staggered manner.

Figure 6:
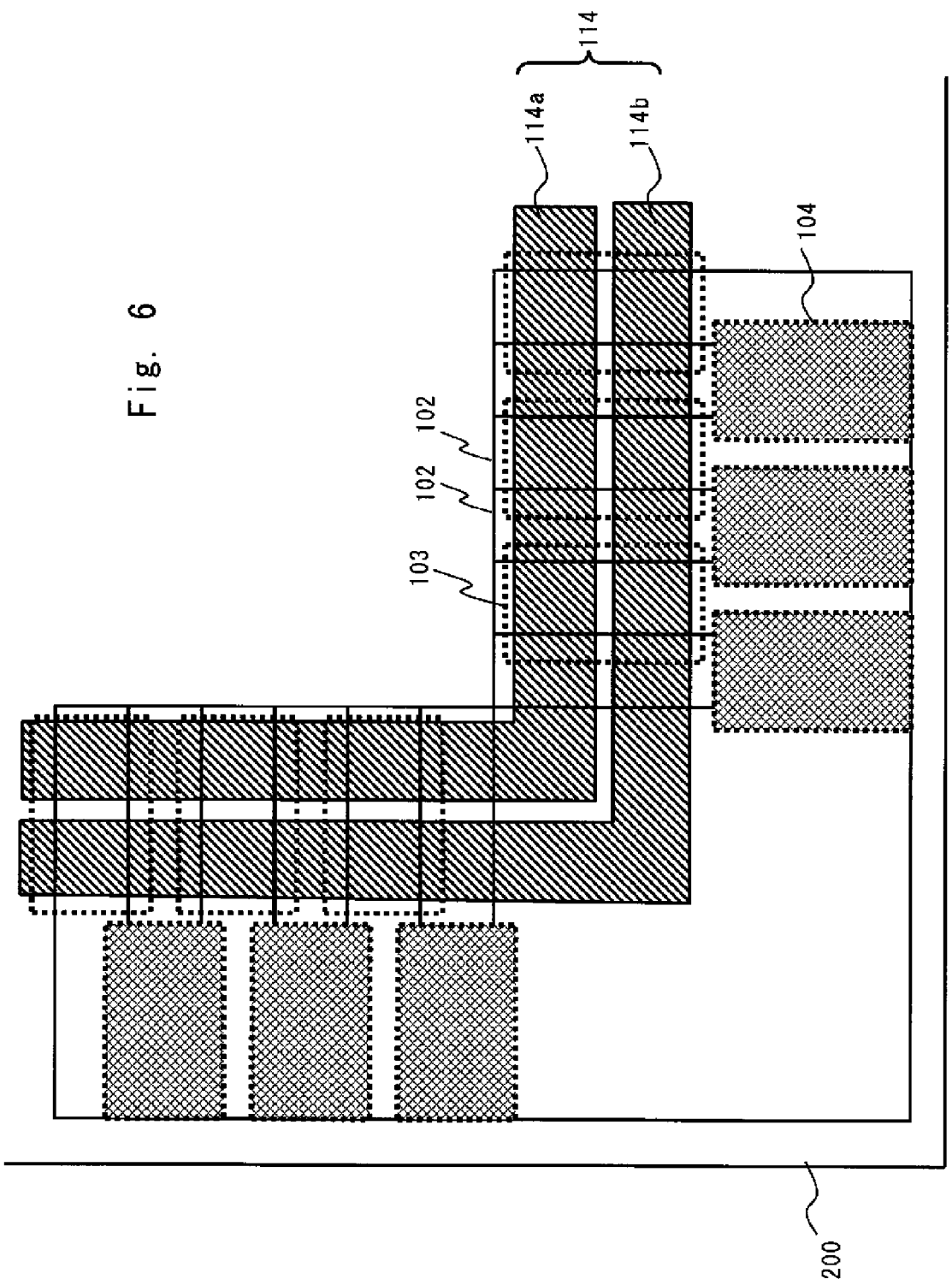
FIG. 6 is a plan view showing a configuration of a main part of the semiconductor chip shown in FIG. 5.
Figure 7:
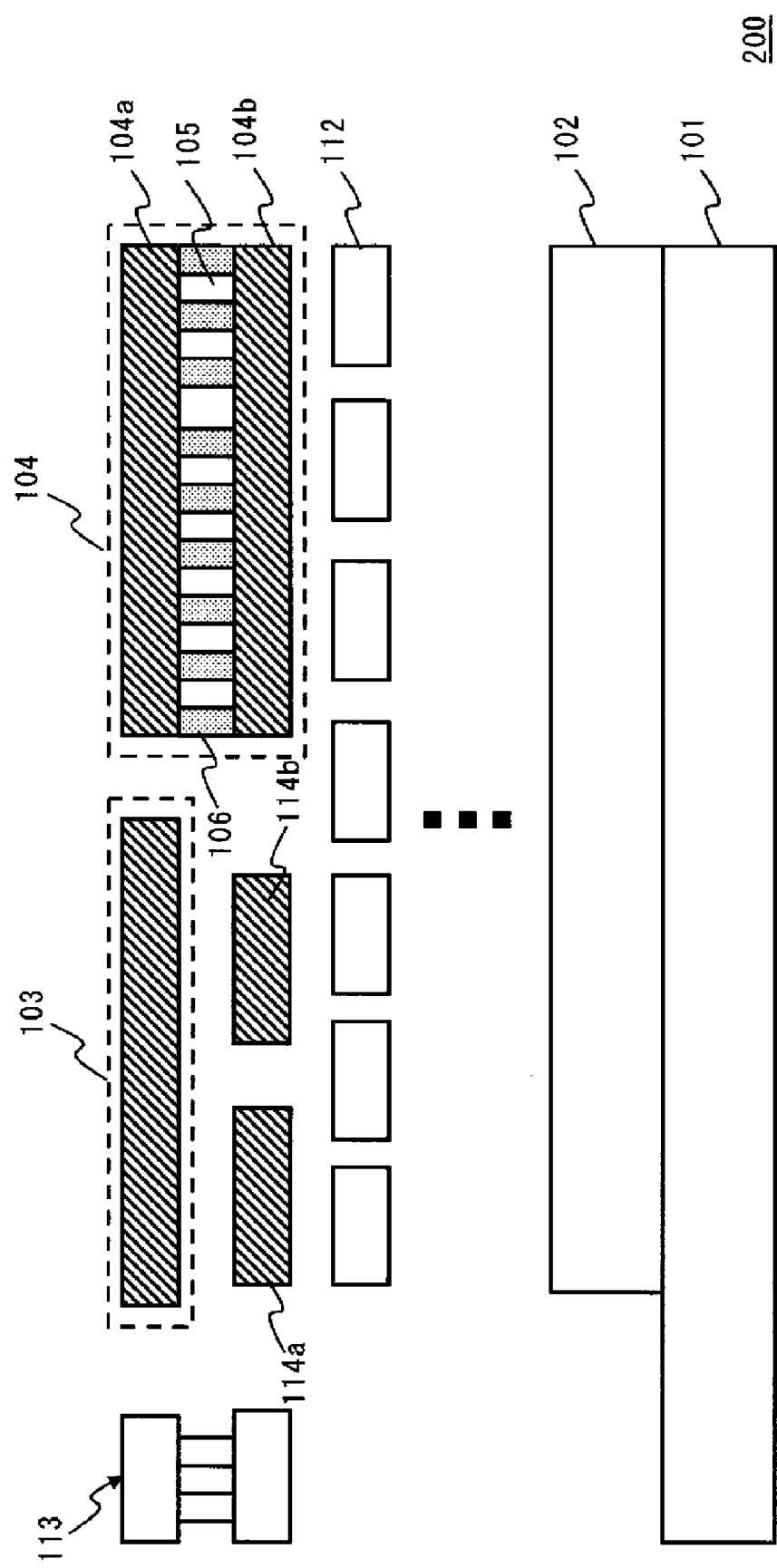
FIG. 7 is a sectional view showing a configuration of a main part of the semiconductor chip shown in FIG. 5.

FIGS. 6 and 7 each illustrate the configuration of the main part of the semiconductor chip 200 shown in FIG. 5. FIG. 6 is a plan view of the semiconductor chip 200. FIG. 7 is a sectional view of the semiconductor chip 200. As shown in FIGS. 6 and 7, the semiconductor chip 200 includes the semiconductor substrate 101, the I/O buffer 102, the single-layer pads 103, the multilayer pads 104, an I/O looped power supply line 112, an internal power supply mesh 113, and an I/O buffer power supply reinforcing line 114.

As in the first exemplary embodiment, the I/O buffer 102 is formed at a peripheral portion of the semiconductor substrate 101. In FIG. 7, the left side indicates the inside of the semiconductor chip 200, and the right side indicates the outside of the semiconductor chip 200. N metal layers are formed above the semiconductor substrate 101. The multilayer pad 104 includes the first pad 104a formed of the uppermost N-layer metal, and the second pad 104b formed of the N-1 layer metal which is formed below the first pad 104a. Each of the single-layer pads 103 is formed of the uppermost N-layer metal. The single-layer pads 103 and the multilayer pads 104 are provided separately from each other. As described above, the single-layer pads 103 are pads dedicated to bonding, and the multilayer pads 104 are pads on which both bonding and probing are performed.

The I/O buffer 102 is formed of a metal layer which is formed below the N-layer metal and the N-1 layer metal. As shown in FIG. 7, the I/O looped power supply line 112 connected to the I/O buffer 102 is formed above the I/O buffer 102. The I/O looped power supply line 112 is a metal layer which is formed above the I/O buffer 102 and is formed of a metal layer located below the N-1 layer metal.

The internal power supply mesh 113 is formed inside the semiconductor chip 200. The internal power supply mesh 113 is formed of the N-layer metal and the N-1 layer metal. The I/O buffer power supply reinforcing line 114 is formed between the I/O buffer 102 and the single-layer pad 103. That is, the single-layer pad 103 is formed above the I/O buffer power supply reinforcing line 114.

The I/O buffer power supply reinforcing line 114 is formed of the N-1 layer metal. In other words, the I/O buffer power supply reinforcing line 114 is formed of a metal layer which is the same layer as the second pad 104b and the lower layer of the internal power supply mesh 113. As shown in FIG. 6, the I/O buffer power supply reinforcing line 114 includes an I/O GND power supply reinforcing line 114a for reinforcing a GND power supply of the I/O buffer 102, and an I/O VDD power supply reinforcing line 114b for reinforcing a VDD power supply of the I/O buffer 102. The I/O buffer power supply reinforcing line 114 is formed along the periphery of the semiconductor chip 200.

In this manner, the multilayer pads 104 are arranged on the peripheral portion of the semiconductor chip 200 and the single-layer pads 103 are arranged inside the multilayer pads 104. Thus, the I/O buffer power supply reinforcing line 114 can be formed of the metal layer located below the single-layer pads 103. Note that the thickness of the stacked N metal layers increases toward the upper layer. Accordingly, a metal layer located close to the upper layer can be used for the I/O buffer power supply reinforcing line 114, which makes it possible to reduce wiring resistance. As a result, the power supply of the I/O buffer 102 can be reinforced without increasing the number of wiring layers.

Third Exemplary Embodiment

Figure 8:
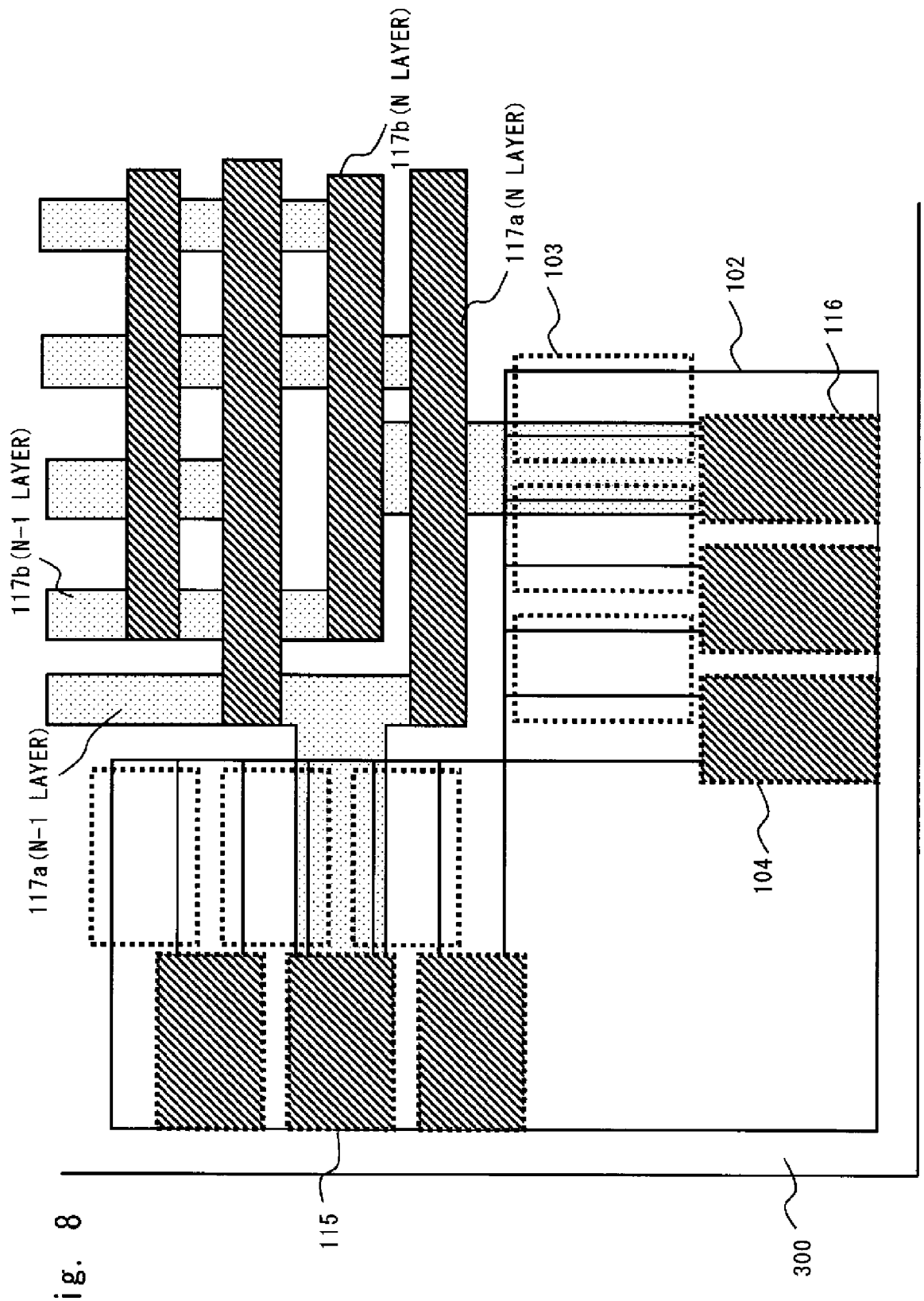
FIG. 8 is a plan view showing a configuration of a main part of a semiconductor chip according to a third exemplary embodiment of the present invention.
Figure 9:
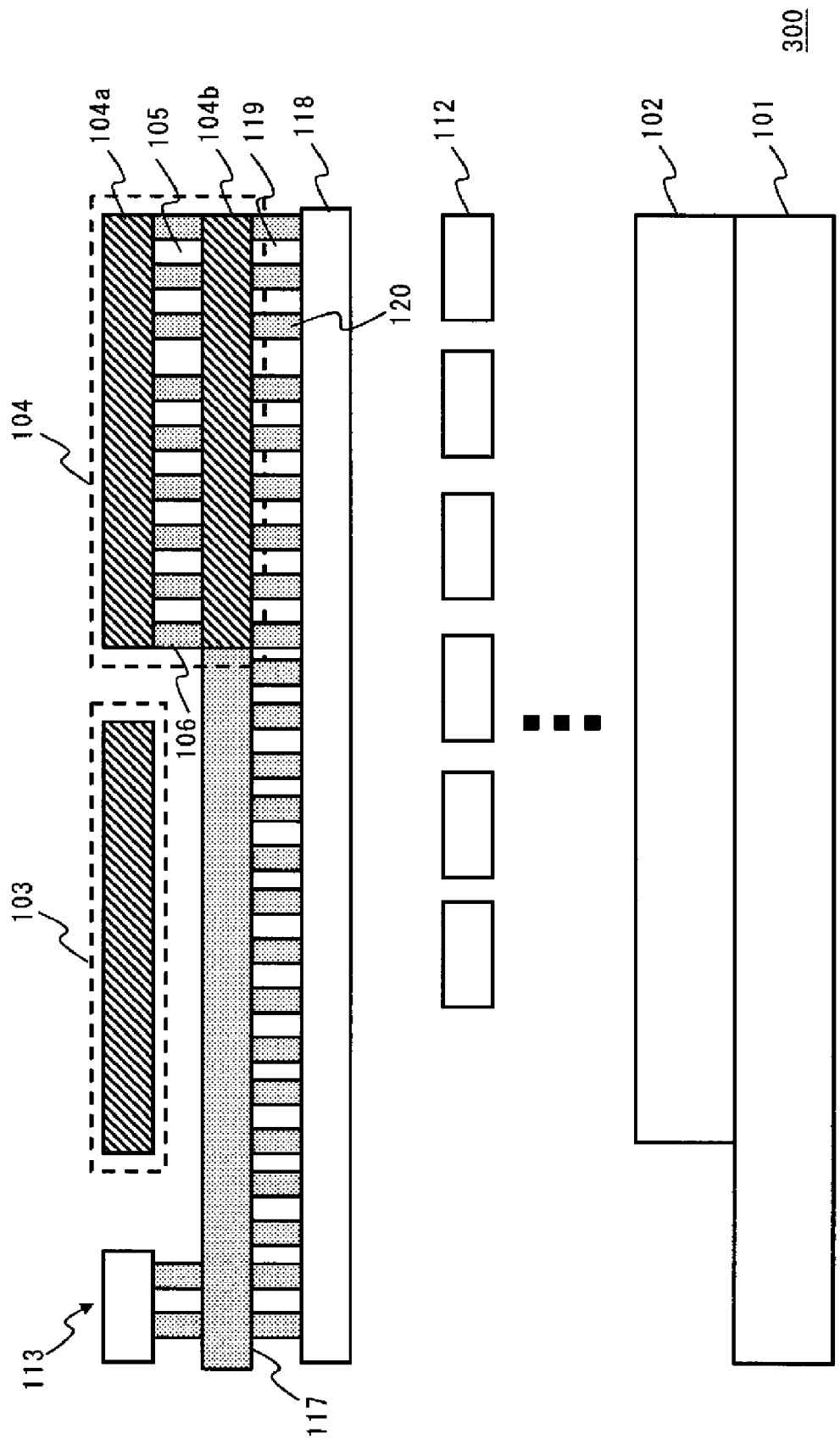
FIG. 9 is a sectional view showing a configuration of a main part of the semiconductor chip shown in FIG. 8.

A semiconductor integrated circuit according to a third exemplary embodiment of the present invention will be described with reference to FIGS. 8 and 9. FIG. 8 is a plan view showing the configuration of a semiconductor chip 300 according to this exemplary embodiment. FIG. 9 is a sectional view of the semiconductor chip 300. In FIGS. 8 and 9, components identical with those described above are denoted by the same reference symbols, and the description thereof is omitted as appropriate.

In this exemplary embodiment, like in FIG. 5, two pad rows are arranged along each edge of the semiconductor chip. The multilayer pads 104 are formed in the outermost pad row, and the single-layer pads 103 are formed in the pad row located inside the outermost pad row. The single-layer pads 103 and the multilayer pads 104 are arranged in a staggered manner.

As in the first exemplary embodiment, each of the multilayer pads 104 includes the first pad 104a formed of the uppermost N-layer metal, and the second pad 104b formed of the N-1 layer metal which is formed below the first pad 104a. Each of the single-layer pads 103 is formed of the uppermost N-layer metal. The single-layer pads 103 and the multilayer pads 104 are provided separately from each other. As described above, the single-layer pads 103 are pads dedicated to bonding, and the multilayer pads 104 are pads on which both bonding and probing are performed.

As shown in FIG. 8, the multilayer pads 104 include a core GND pad 115 for providing a GND power supply to the internal power supply mesh 113, and a core VDD pad 116 for providing a VDD power supply to the internal power supply mesh 113. The core GND pad 115 is connected to a core GND power supply reinforcing line 117a. The core VDD pad 116 is connected to a core VDD power supply reinforcing line 117b.

Each of the core GND power supply reinforcing line 117a and the core VDD power supply reinforcing line 117b has a portion formed of the N-layer metal and a portion formed of the N-1 layer metal. In portions where the N-layer metal and the N-1 layer metal are overlapped with each other, the N-layer metal and the N-1 layer metal are connected through vias which are formed in the interlayer insulating layer.

As shown in FIG. 9, the I/O looped power supply line 112 connected to the I/O buffer 102 is formed above the I/O buffer 102. The I/O looped power supply line 112 is a metal layer which is formed above the I/O buffer 102 and is formed of a metal layer located below an N-2 layer metal 118.

The internal power supply mesh 113 is formed inside the semiconductor chip 300. An internal core power supply reinforcing line 117 is formed between the I/O buffer 102 and the single-layer pad 103, and includes the core GND power supply reinforcing line 117a and the core VDD power supply reinforcing line 117b. The single-layer pad 103 is formed above the internal core power supply reinforcing line 117 and the I/O looped power supply line 112.

The internal core power supply reinforcing line 117 is formed of the N-1 layer metal and the N-2 layer metal 118. An interlayer insulating layer 119 is formed between the N-2 layer metal 118 and the N-1 layer metal. The N-2 layer metal 118 and the N-1 layer metal are connected through vias 120.

In this manner, the multilayer pads 104 are arranged on the peripheral portion of the semiconductor chip 300, and the single-layer pads 103 are arranged inside the multilayer pads 104. Thus, the internal core power supply reinforcing line 117 can be formed of the metal layer located below the single-layer pads 103. Accordingly, the number of lead-in wiring layers extending from the core GND pad 115 or the core VDD pad 116 can be increased, and the wiring resistance can be reduced. As a result, the power supply of the internal power supply mesh 113 can be reinforced.

Figure 10:
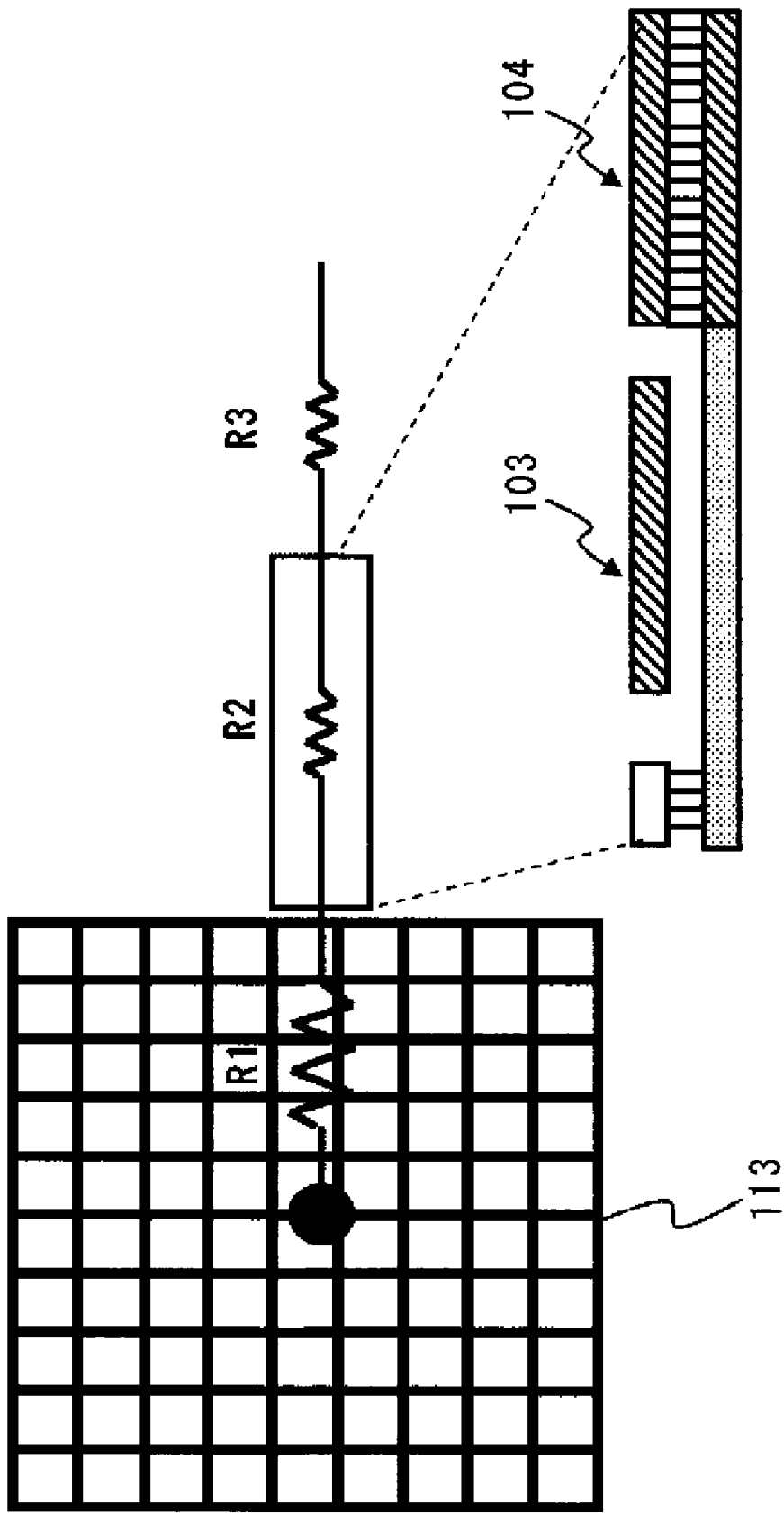
FIG. 10 is a diagram for explaining an advantageous effect of the semiconductor chip according to the third exemplary embodiment.

Advantageous effects of the semiconductor integrated circuit according to this exemplary embodiment will be described with reference to FIGS. 10 to 12. As shown in FIG. 10, the semiconductor chip 300 includes a resistance R1 of the internal power supply mesh 113, a resistance R2 of the lead-in wire extending from the multilayer pad 104 to the internal power supply mesh 113, and a resistance R3 of the bonding wire 108.

Conventionally, a power supply pad needs to be provided separately to reinforce an internal core power supply. In this case, each power supply has the resistances as mentioned above. Meanwhile, in the semiconductor chip 300 according to this exemplary embodiment, the internal core power supply reinforcing line 117 is formed to achieve reinforcement of the power supply. This eliminates the need of separately providing the power supply pad for reinforcing the internal core power supply, unlike the conventional case. Moreover, the wiring resistance can be reduced.

Figure 11:
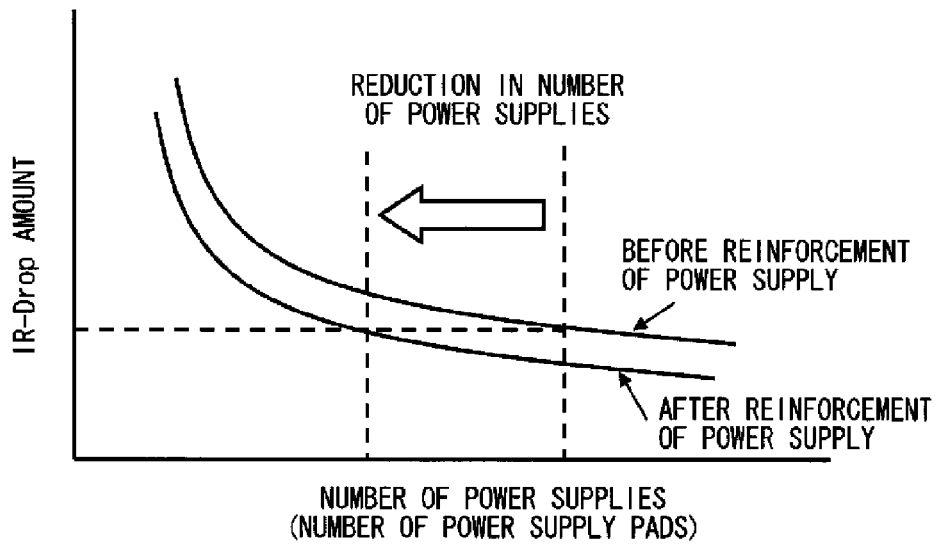
FIG. 11 is a diagram for explaining another advantageous effect of the semiconductor chip according to the third exemplary embodiment.
Figure 12:
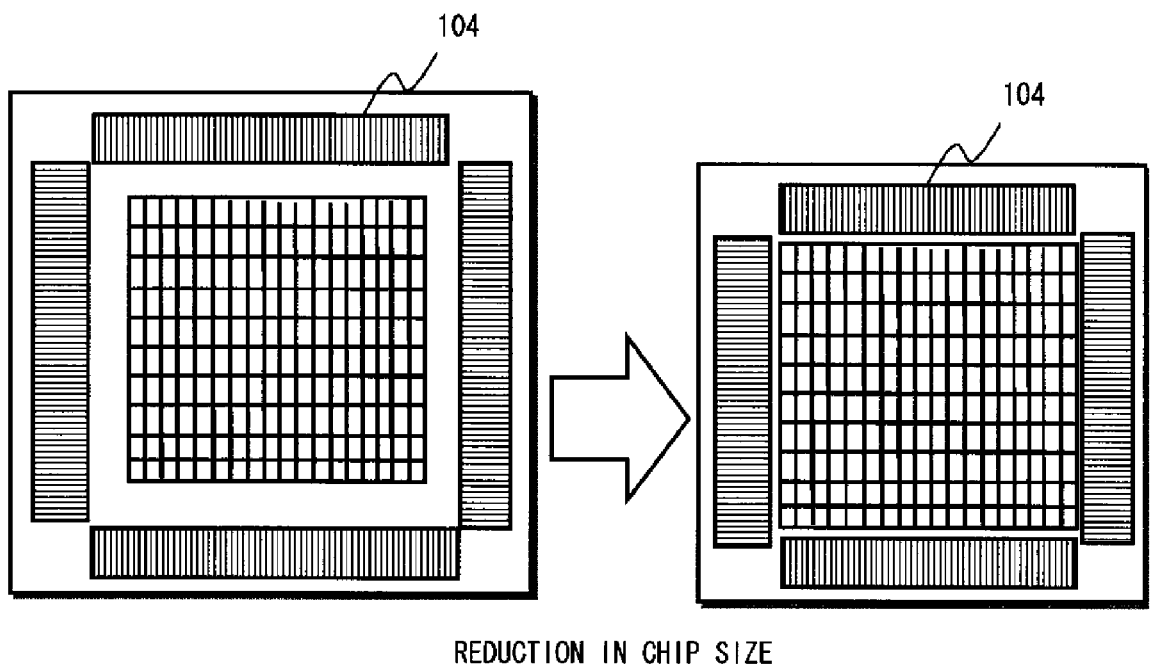
FIG. 12 is a diagram for explaining still another advantageous effect of the semiconductor chip according to the third exemplary embodiment.

Accordingly, as shown in FIG. 11, a voltage drop (IR Drop) due to resistance components of power supply lines can be reduced, and the number of power supply pads (number of power supplies) can be reduced. Consequently, as shown in FIG. 12, the number of the multilayer pads 104 can be reduced, which results in a reduction in the size of the semiconductor chip.

Fourth Exemplary Embodiment

Figure 13:
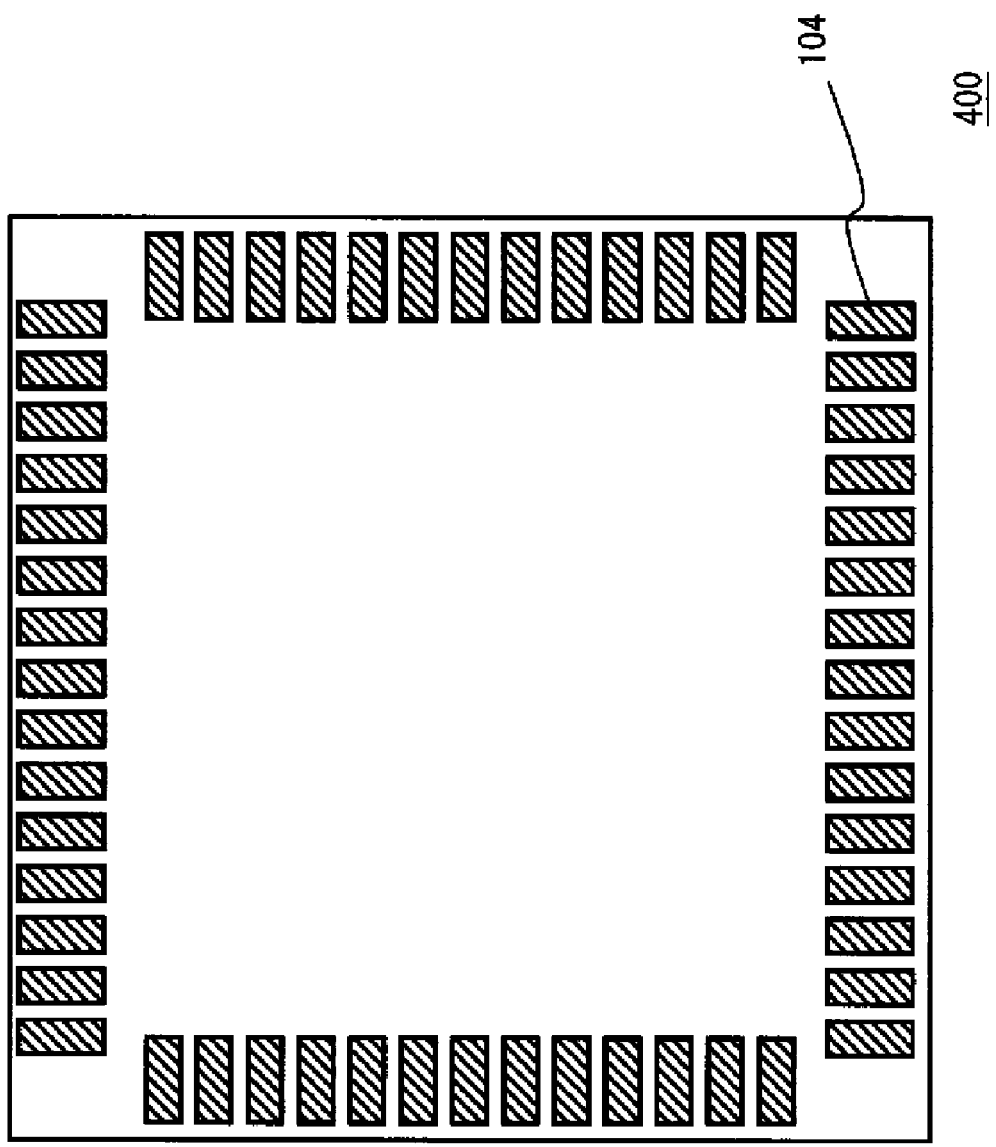
FIG. 13 is a diagram showing a configuration of a semiconductor chip according to a fourth exemplary embodiment of the present invention.
Figure 14:
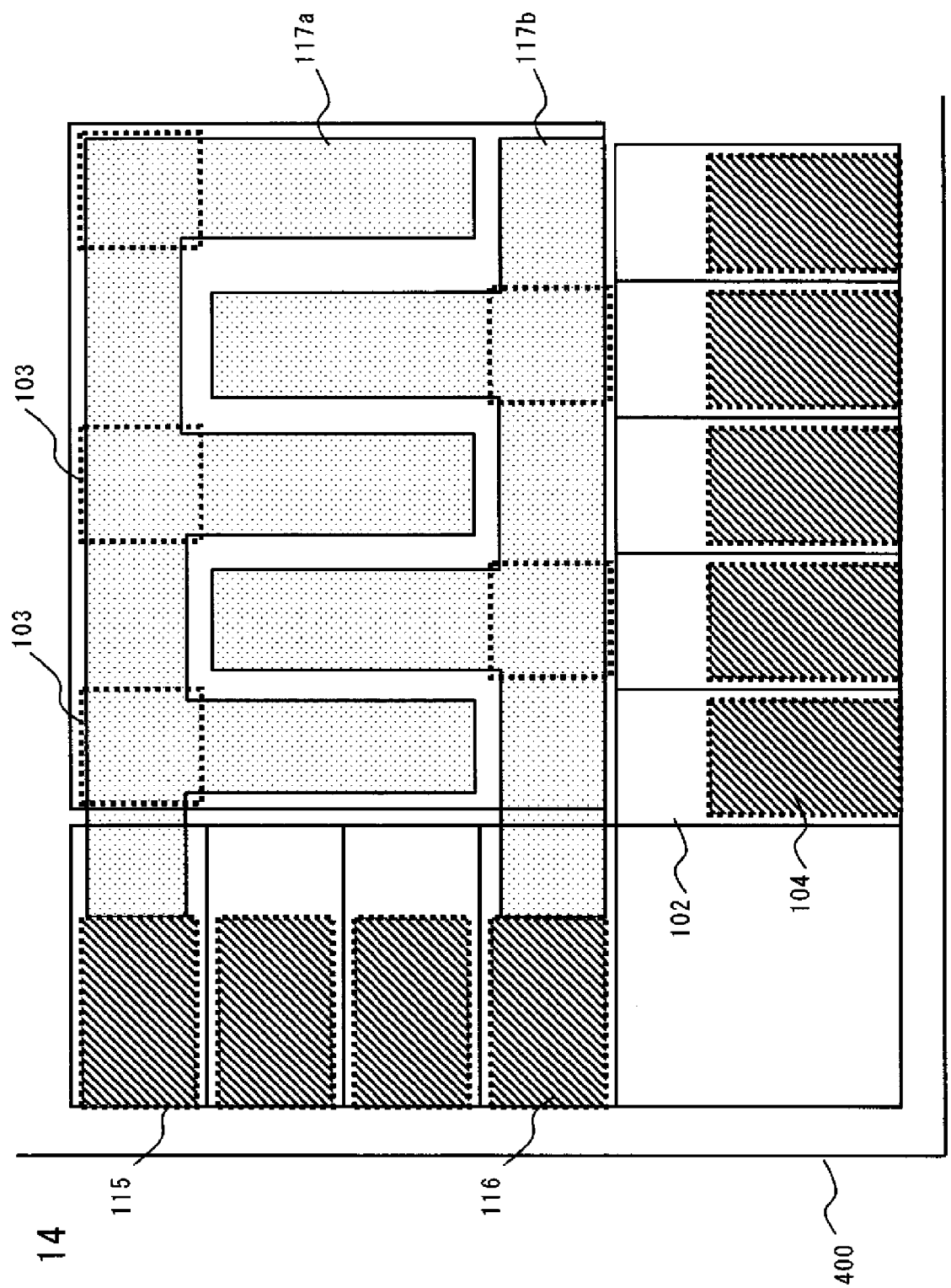
FIG. 14 is a plan view showing a configuration of a main part of the semiconductor chip shown in FIG. 13.

A semiconductor integrated circuit according to a fourth exemplary embodiment of the present invention will be described with reference to FIGS. 13 and 14. FIG. 13 is a diagram showing the configuration of a semiconductor chip 400 according to this exemplary embodiment. FIG. 14 is a plan view showing the configuration of the main part of the semiconductor chip 400 shown in FIG. 13.

The semiconductor chip 400 according to this exemplary embodiment is suitable for a high-speed macro such as a CPU core. As shown in FIG. 13, in this exemplary embodiment, one pad row is formed along each edge of the semiconductor chip 400. In each pad row formed along the outer periphery of the semiconductor chip 400, the multilayer pads 104 are formed.

As in the first exemplary embodiment, the I/O buffer 102 is formed at a peripheral portion of the semiconductor substrate 101. The multilayer pads 104 are formed above the I/O buffer 102. As shown in FIG. 14, the multilayer pads 104 include the core GND pad 115 and the core VDD pad 116. The core GND pad 115 is connected to the core GND power supply reinforcing line 117a, and the core VDD pad 116 is connected to the core VDD power supply reinforcing line 117b.

The single-layer pads 103 are formed above the core GND power supply reinforcing line 117a and the core VDD power supply reinforcing line 117b. The high-speed macro enables a high-speed circuit operation and has a large current consumption. Thus, the single-layer pads 103 formed above the internal core power supply reinforcing line 117 enable reinforcement of the power supply. As described above, the single-layer pads 103 are pads dedicated to bonding, and the multilayer pads 104 are pads on which both bonding and probing are performed.

Figure 15:
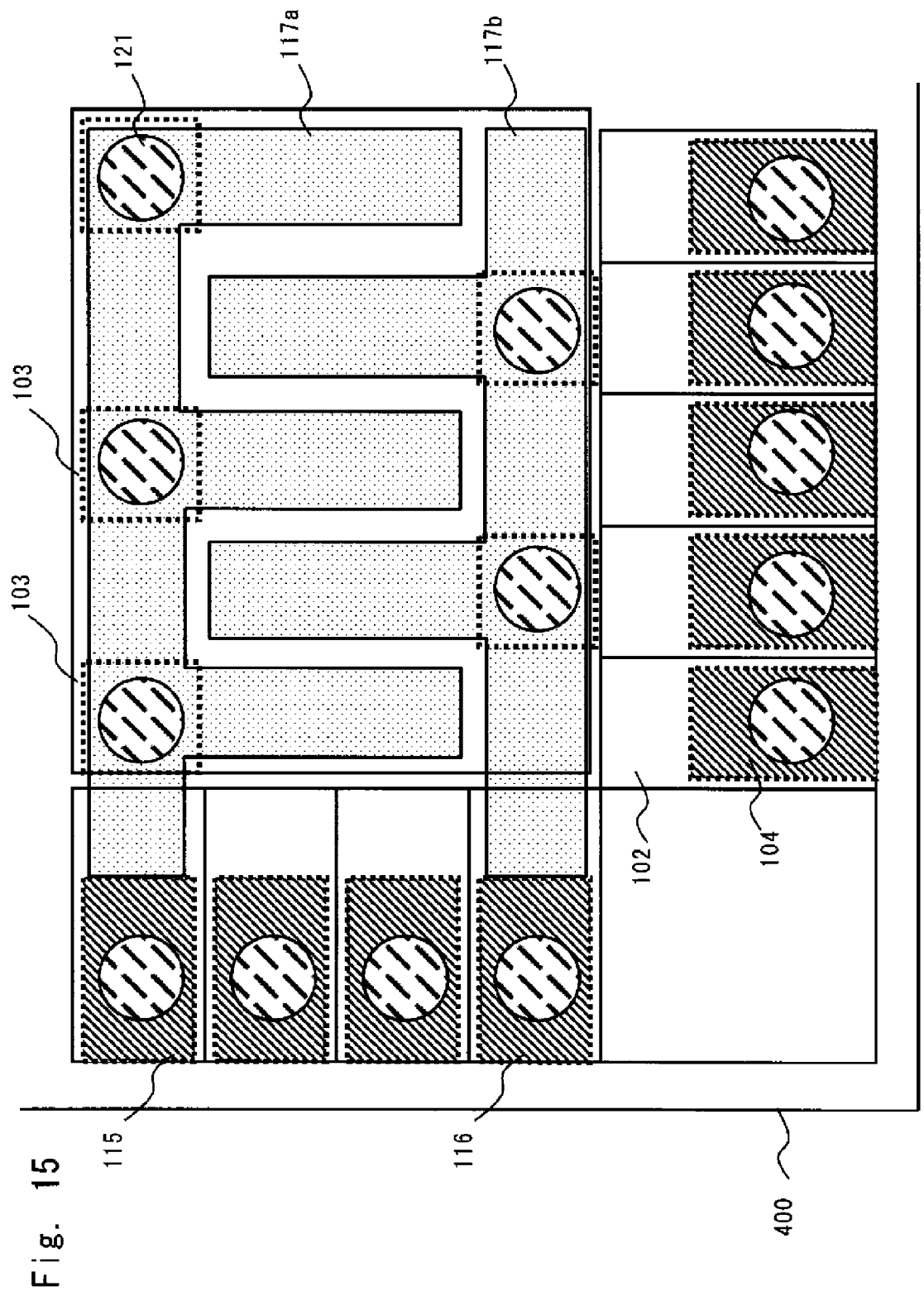
FIG. 15 is a plan view showing another configuration of a main part of the semiconductor chip shown in FIG. 13.
Figure 16:
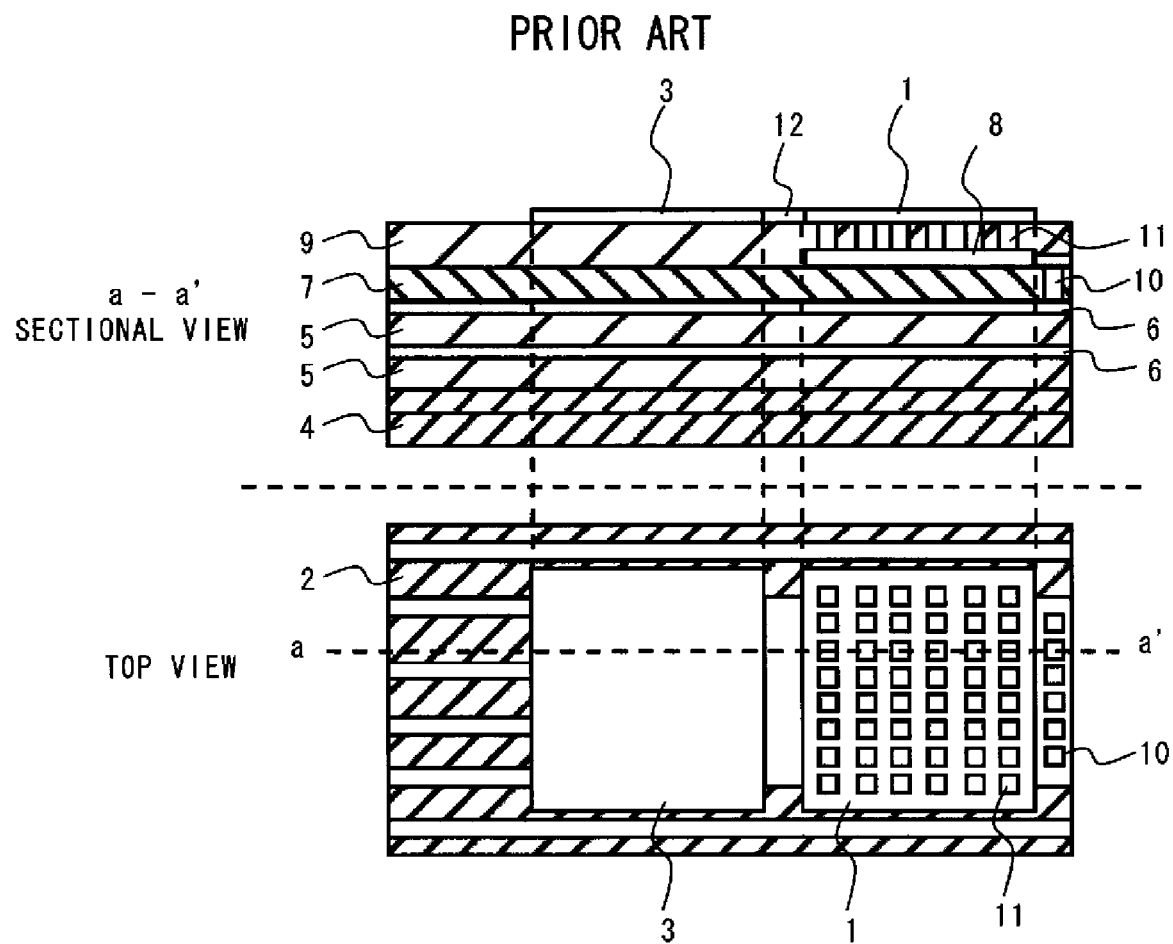
FIG. 16 is a diagram showing a configuration of a semiconductor device disclosed in Japanese Unexamined Patent Application Publication No. 2004-63540.

FIG. 15 shows another configuration of the main part of the semiconductor chip shown in FIG. 13. In the example shown in FIG. 15, a solder ball 121 is formed on each of the single-layer pads 103. In this way, the mounting method is not limited to wire bonding, and any mounting method can be employed. Instead of using the solder ball 121, flip-flop mounting may be performed after the bonding wire 108 is cut and only the bonding 110 is left.

As described above, according to exemplary embodiments of the present invention, the single-layer pads 103 and the multilayer pads 104 are formed separately from each other, thereby enhancing the degree of freedom in the layout of pads for bonding. Further, only bonding is performed on the single-layer pad 103 formed of a single metal layer, and probing is not performed thereon. Accordingly, peeling or the like of the pads is prevented and the bonding strength can be increased.

Furthermore, the multilayer pads 104 are arranged on the peripheral portion of the semiconductor chip 200, and the single-layer pads 103 are arranged inside the multilayer pads 104. As a result, the reinforcement of the power supply of the I/O buffer 102 can be achieved without increasing the number of wiring layers. Moreover, the size of the semiconductor chip can be reduced.

The present invention is not limited to the above exemplary embodiments, and can be modified in various manners without departing from the scope of the present invention.

The first to fourth exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor integrated circuit comprising:
an I/O buffer provided in a semiconductor chip;
single-layer pads formed above the I/O buffer; and
multilayer pads formed above the I/O buffer separately from the single-layer pads, such that the single-layer pads and the multilayer pads are separately arranged, thereby enhancing the degree of freedom in the layout of pads in the semiconductor integrated circuit.

2. The semiconductor integrated circuit according to claim 1, wherein the single-layer pads are pads dedicated to bonding.

3. The semiconductor integrated circuit according to claim 1, wherein the multilayer pads are pads on which at least probing is performed.

4. The semiconductor integrated circuit according to claim 3, wherein the multilayer pads are pads on which bonding is further performed.

5. The semiconductor integrated circuit according to claim 1, wherein the multilayer pads each have a probe mark formed thereon.

6. The semiconductor integrated circuit according to claim 1, wherein the single-layer pads and the multilayer pads are arranged in a staggered manner, and the single-layer pads are arranged inside the multilayer pads of the semiconductor chip.

7. A semiconductor integrated circuit comprising:
an I/O buffer provided in a semiconductor chip;
single-layer pads formed above the I/O buffer; and
multilayer pads formed above the I/O buffer separately from the single-layer pads, wherein the single-layer pads and the multilayer pads are arranged in a staggered manner, and the single-layer pads are arranged inside the multilayer pads of the semiconductor chip, the semiconductor integrated circuit further comprising an I/O buffer power supply reinforcing line connected to the I/O buffer, wherein the single-layer pads are formed above the I/O buffer power supply reinforcing line.

8. The semiconductor integrated circuit according to claim 7, further comprising an I/O looped power supply line connected to the I/O buffer, wherein the single-layer pads are formed above the I/O looped power supply line.

9. A semiconductor integrated circuit comprising:
an I/O buffer provided in a semiconductor chip;
single-layer pads formed above the I/O buffer; and
multilayer pads formed above the I/O buffer separately from the single-layer pads, wherein the single-layer pads and the multilayer pads are arranged in a staggered manner, and the single-layer pads are arranged inside the multilayer pads of the semiconductor chip, the semiconductor integrated circuit further comprising:

an internal core circuit formed inside the single-layer pads and the multilayer pads of the semiconductor chip; and an internal core power supply reinforcing line connected to the internal core circuit, wherein the single-layer pads are formed above the internal core power supply reinforcing line.

10. A semiconductor integrated circuit comprising:

an I/O buffer provided in a semiconductor chip;

single-layer pads formed above the I/O buffer; and multilayer pads formed above the I/O buffer separately from the single-layer pads, the semiconductor integrated circuit further comprising:

an internal core circuit formed inside the multilayer pads of the semiconductor chip; and an internal core power supply reinforcing line connected to the internal core circuit, wherein the multilayer pads are arranged along a peripheral portion of the semiconductor chip, and the single-layer pads are formed above the internal core power supply reinforcing line.

* * * * *